US007363601B2

(12) United States Patent
Heng et al.

(10) Patent No.: US 7,363,601 B2
(45) Date of Patent: Apr. 22, 2008

(54) INTEGRATED CIRCUIT SELECTIVE SCALING

(75) Inventors: Fook-Luen Heng, Yorktown Heights, NY (US); Jason D. Hibbeler, Williston, VT (US); Kevin W. McCullen, Essex Junction, VT (US); Rani R. Narayan, San Jose, CA (US); Stephen L. Runyon, Pflugerville, TX (US); Robert F. Walker, St. George, VT (US)

(73) Assignee: International Business Machines Corporation, Armonk, NY (US)

( * ) Notice: Subject to any disclaimer, the term of this patent is extended or adjusted under 35 U.S.C. 154(b) by 23 days.

(21) Appl. No.: 10/711,959

(22) Filed: Oct. 15, 2004

(65) Prior Publication Data

US 2006/0085768 A1   Apr. 20, 2006

(51) Int. Cl.
  *G06F 17/50* (2006.01)
(52) U.S. Cl. .................. 716/3; 716/2; 716/9; 716/10
(58) Field of Classification Search .................. 716/4, 716/2, 6, 8, 11, 19, 3, 9, 10; 438/14, 462
See application file for complete search history.

(56) References Cited

U.S. PATENT DOCUMENTS

| | | | | |
|---|---|---|---|---|
| 5,406,497 A | * | 4/1995 | Altheimer et al. | 716/6 |
| 5,625,568 A | * | 4/1997 | Edwards et al. | 716/2 |
| 5,936,868 A | * | 8/1999 | Hall | 716/4 |
| 6,209,122 B1 | * | 3/2001 | Jyu et al. | 716/6 |
| 6,226,560 B1 | * | 5/2001 | Hama et al. | 700/97 |
| 6,507,807 B1 | * | 1/2003 | McBride | 703/14 |
| 6,543,036 B1 | * | 4/2003 | Iyer et al. | 716/6 |
| 6,584,598 B2 | * | 6/2003 | Rao et al. | 716/2 |
| 6,756,242 B1 | * | 6/2004 | Regan | 438/14 |
| 6,813,753 B2 | * | 11/2004 | Jones | 716/6 |
| 6,880,133 B2 | * | 4/2005 | Meyer et al. | 716/1 |
| 6,895,568 B2 | * | 5/2005 | Li | 716/10 |
| 6,986,109 B2 | * | 1/2006 | Allen et al. | 716/2 |
| 7,039,881 B2 | * | 5/2006 | Regan | 716/3 |
| 7,055,114 B2 | * | 5/2006 | Kever et al. | 716/2 |
| 7,111,261 B2 | * | 9/2006 | Jones | 716/6 |
| 2003/0084418 A1 | * | 5/2003 | Regan | 716/14 |
| 2003/0217347 A1 | * | 11/2003 | Meyer et al. | 716/8 |
| 2004/0064797 A1 | * | 4/2004 | Li | 716/5 |
| 2004/0073877 A1 | * | 4/2004 | Jones | 716/6 |
| 2004/0128638 A1 | * | 7/2004 | Kerzman et al. | 716/11 |
| 2004/0230922 A1 | * | 11/2004 | Allen et al. | 716/2 |
| 2005/0039156 A1 | * | 2/2005 | Catthoor et al. | 716/18 |

(Continued)

FOREIGN PATENT DOCUMENTS

WO    WO 99/11043    4/1999

(Continued)

*Primary Examiner*—Phallaka Kik
(74) *Attorney, Agent, or Firm*—Richard M. Kotulak; Hoffman Warnick & D'Alessandro LLC

(57) ABSTRACT

Methods, systems and program products are disclosed for selectively scaling an integrated circuit (IC) design: by layer, by unit, or by ground rule, or a combination of these. The selective scaling technique can be applied in a feedback loop with the manufacturing system with process and yield feedback, during the life of a design, to increase yield in early processes in such a way that hierarchy is preserved. The invention removes the need to involve designers in improving yield where new technologies such as maskless fabrication are implemented.

10 Claims, 3 Drawing Sheets

U.S. PATENT DOCUMENTS

| | | |
|---|---|---|
| 2005/0048741 A1* | 3/2005 | Phan et al. ................. 438/462 |
| 2005/0066300 A1* | 3/2005 | Zach ........................... 716/19 |
| 2005/0081167 A1* | 4/2005 | Kever et al. ................... 716/2 |
| 2005/0125748 A1* | 6/2005 | Gray et al. .................... 716/2 |
| 2005/0229130 A1* | 10/2005 | Wu et al. ...................... 716/8 |
| 2005/0257178 A1* | 11/2005 | Daems et al. ................. 716/2 |

FOREIGN PATENT DOCUMENTS

WO     WO 03/012720 A1     2/2003

\* cited by examiner

INTEGRATED CIRCUIT SELECTIVE SCALING

BACKGROUND OF THE INVENTION

1. Technical Field

The present invention relates generally to integrated circuit design, and more particularly, to selectively scaling an integrated circuit design layout by: layer, region or cell, or a combination of these, for the purposes of increasing yield in early processes in such a way that hierarchy is preserved.

2. Related Art

One way of modifying an existing very large scale integrated (VLSI) circuit design to increase its manufacturing yield is to spread wires and add redundant vias in order to decrease critical area and increase via reliability. However, in the early stages of a new manufacturing process, these post-layout modifications alone may not be sufficient to achieve the desired yield improvement. Another yield-enhancing modification to an existing layout is to relax the spacing and width tolerances, which can be accomplished by a geometric scaling process. A challenge arises, however, when this scaling is attempted on only certain design layers and in the presence of certain other geometric constraints or in the presence of hierarchy. For example, back-end-of-line (BEOL) layers might be chosen for scaling but without altering any device sizes, and with the requirement that the location of connections from the top-level wiring to the integrated-circuit package remain fixed.

A simple linear geometric scaling (i.e., multiplying the coordinates of every object in the design database by a fixed scaling factor) is obviously inadequate if connectivity is to be maintained between layers that are scaled and layers that are not scaled. The problem of hierarchical scaling itself is difficult to solve. One approach is addressed in co-pending U.S. patent application Ser. No. 10/438,625 (currently pending), entitled "A Practical Method for Hierarchical-Preserving Layout Optimization of Integrated Circuit Layout," which is hereby incorporated by reference. Another approach is selective scaling, an example of which is disclosed in U.S. Pat. No. 6,756,242 to Regan. Regan, however, teaches scaling an entire design with different scaling factors in an X direction and a Y direction, which is also inadequate if connectivity is to be maintained between layers.

In semiconductor manufacturing, design layouts are completed with a set of fixed ground rules that are provided to the designers by the manufacturing organization. The ground rules describe process and lithography best estimates of what is manufacturable. The ground rules attempt to balance chip density on a wafer (aggressiveness) with what can be reliably manufactured (conservatism). During the lifetime of a technology process or a design, "learning" takes place through failure analysis on finished products and in the manufacturing line. If implemented, this learning can improve yields. For example, the ground rules may change to reflect the yield learning. Unfortunately, frequent or considerable changes cannot usually be made because implementation of any change is expensive because each requires designer involvement in modifying the design to reflect the new ground rules. More significantly, any design modification typically requires new masks, which are extremely expensive. Accordingly, design changes are historically only made very infrequently. Yield related design changes may be added if functional changes require new masks (i.e., if there are difficulties with the function or performance which require a new design iteration), or if there are significant yield issues which force a new design iteration in order to achieve cost targets.

Future manufacturing and design environments, however, provide several important aspects that may allow significant improvement of this process: First, maskless lithography has been proposed for future technologies, which if implemented will eliminate the costs of additional mask sets for a changed design. Second, improved simulation and validation capabilities may provide the ability to do more "full-up" simulations of designs because of improved algorithms, parallel processing, and system architectures. In this fashion, selective scaling may be applied in a tightly coupled feedback loop with the manufacturing line with process and yield feedback, during the life of a design. In current manufacturing and design environments, limited mask lifespans offer the opportunity for periodic layout updates during the life of a design.

In view of the foregoing, there is a need in the art to address the problems of the related art.

SUMMARY OF THE INVENTION

The invention includes methods, systems and program products for selectively scaling an integrated circuit (IC) design by: layer, region or cell, or a combination of these. The selective scaling technique can be applied in a feedback loop with the manufacturing system with process and yield feedback, during the life of a design, to increase yield in early processes in such a way that hierarchy is preserved. The invention removes the need to involve designers in improving yield.

A first aspect of the invention is directed to a method for selectively scaling an integrated circuit design layout, the method comprising the steps of: identifying a scaling target for at least one problem object of the design layout based on manufacturing information; defining technology ground rules and methodology constraints for each problem object; determining a scaling factor for each problem object; determining which at least one of a plurality of scaling techniques is to be applied to each problem object, and scaling each problem object with a respective at least one scaling technique and scaling factor; and in the case that assembly is required, performing placement and routing to assemble the design using the scaled problem object.

A second aspect is directed to a system for selectively scaling an integrated circuit design layout, the system comprising the steps of: means for identifying a scaling target for at least one problem object of the design layout based on manufacturing information; means for defining technology ground rules and methodology constraints for each problem object; means for determining a scaling factor for each problem object; means for determining which at least one of a plurality of scaling techniques is to be applied to each problem object, and scaling each problem object with a respective at least one scaling technique and scaling factor; and means for, in the case that assembly is required, performing placement and routing to assemble the design using the scaled problem object.

A third aspect is directed to a computer program product comprising a computer useable medium having computer readable program code embodied therein for selectively scaling an integrated circuit design layout, the program product comprising: program code configured to identify a scaling target for at least one problem object of the design layout based on manufacturing information; program code configured to define technology ground rules and methodology constraints for each problem object; program code configured to determine a scaling factor for each problem object; program code configured to determine which at least one of a plurality of scaling techniques is to be applied to each problem object, and scaling each problem object with a respective at least one scaling technique and scaling factor; and program code configured to, in the case that assembly is required, perform placement and routing to assemble the design using the scaled problem object.

A fourth aspect is directed to a method for improving yield of an integrated circuit design layout during manufacturing, the method comprising the steps of: testing a manufactured design layout and identifying at least one problem object that is a problem; generating a scaling target for each problem object based on manufacturing information obtained during the testing; and feeding back the manufacturing information to a system for selective scaling of the design layout to improve yield using a scaling target for at least one problem object of the design layout based on the manufacturing information.

A fifth aspect of the invention is directed to a system for improving yield of an integrated circuit design layout during manufacturing, the system comprising: means for testing a manufactured design layout and identifying at least one problem object that is a problem; means for generating manufacturing information including a scaling target for each problem object; and means for feeding back the manufacturing information to a system for selective scaling of the design layout to improve yield using a scaling target for at least one problem object of the design layout based on the manufacturing information.

A sixth aspect of the invention is directed to a computer program product comprising a computer useable medium having computer readable program code embodied therein for improving yield of an integrated circuit design layout during manufacturing, the program product comprising: program code configured to test a manufactured design layout and identifying at least one problem object that is a problem; program code configured to generate manufacturing information including a scaling target for each problem object; and program code configured to feedback the manufacturing information to a system for selective scaling of the design layout to improve yield using a scaling target for at least one problem object of the design layout based on the manufacturing information.

The foregoing and other features of the invention will be apparent from the following more particular description of embodiments of the invention.

BRIEF DESCRIPTION OF THE DRAWINGS

The embodiments of this invention will be described in detail, with reference to the following figures, wherein like designations denote like elements, and wherein.

DETAILED DESCRIPTION OF THE INVENTION

For purposes of organization only, the description includes the following headings: I. System Overview, II. Operational Methodology, III. Conclusion.

I. System Overview

Figure 1:
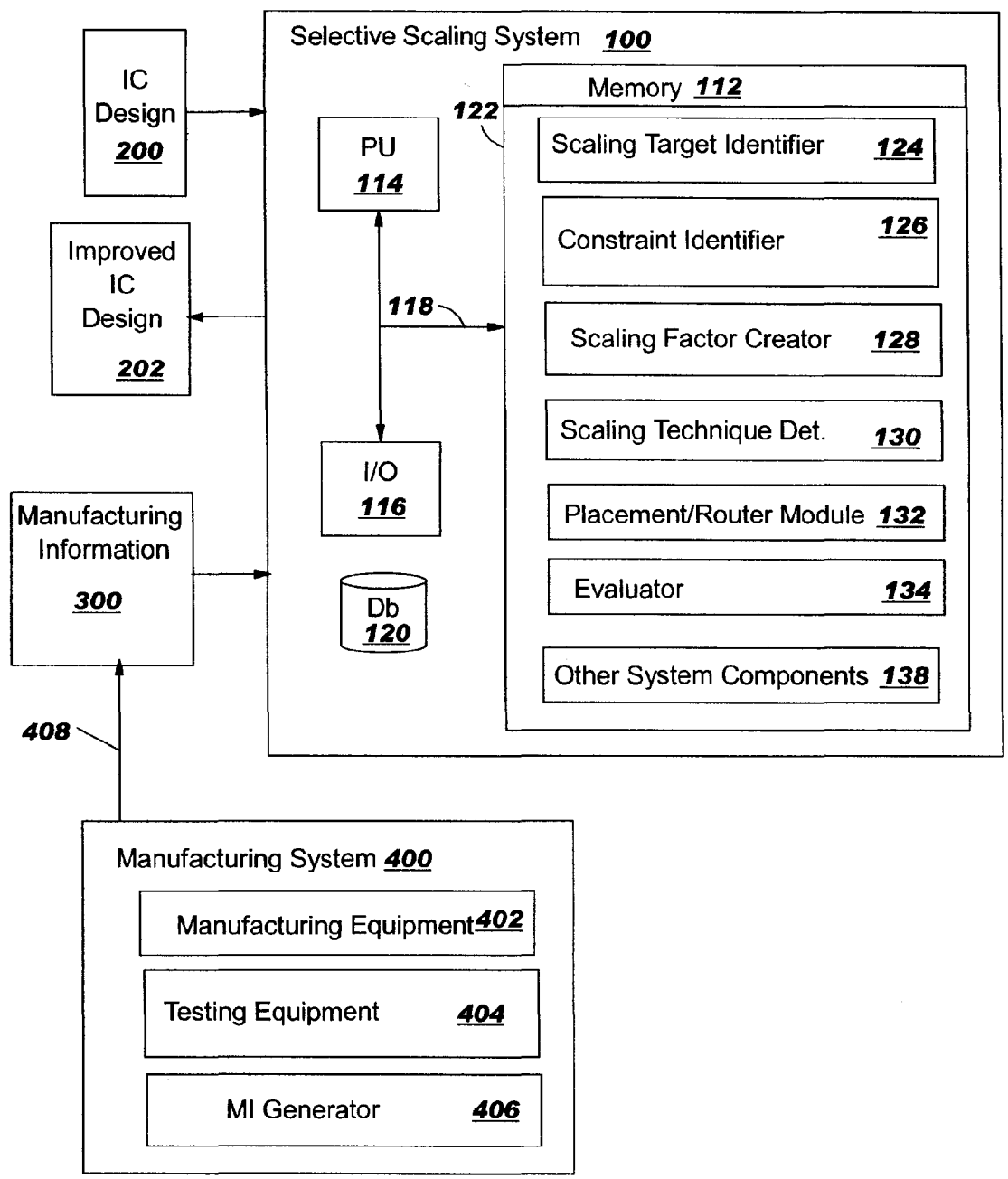
FIG. 1 shows a block diagram of a selective scaling system and a manufacturing system benefiting from the scaling system according to one embodiment of the invention.

With reference to the accompanying drawings, FIG. 1 is a block diagram of an integrated circuit (IC) design selective scaling system 100 according to one embodiment of the invention. System 100 includes a memory 112, a processing unit (PU) 114, input/output devices (I/O) 116 and a bus 118. A database 120 may also be provided for storage of data relative to processing tasks. Memory 112 includes a program product 122 that, when executed by PU 114, comprises various functional capabilities described in further detail below. Memory 112 (and database 120) may comprise any known type of data storage system and/or transmission media, including magnetic media, optical media, random access memory (RAM), read only memory (ROM), a data object, etc. Moreover, memory 112 (and database 120) may reside at a single physical location comprising one or more types of data storage, or be distributed across a plurality of physical systems. PU 114 may likewise comprise a single processing unit, or a plurality of processing units distributed across one or more locations. I/O 116 may comprise any known type of input/output device including a network system, modem, keyboard, mouse, scanner, voice recognition system, CRT, printer, disc drives, etc. Additional components, such as cache memory, communication systems, system software, etc., may also be incorporated into system 100. System 100 receives an IC design 200 to be legalized and outputs an improved IC design 202. It should be recognized that system 100 may be incorporated as a part of a larger IC design system or be provided as a separate system.

As shown in FIG. 1, program product 122 may include a scaling target identifier 124, a constraint definer 126, a scaling factor creator 128, a scaling technique determinator 130, a placement/router module 132, an evaluator 134 and other system components 138. Other system components 138 may include any other necessary functionality not expressly described herein.

It should be recognized that while system 100 has been illustrated as a standalone system, it may be included as part of a larger IC design system or a peripheral thereto. An IC design 200 is input to system 100, and an improved IC design 202 is output from system 100.

Manufacturing system 400 will be described in greater detail below.

II. Operational Methodology

A. Overview

Co-pending U.S. patent application Ser. No. 10/438,625, entitled "A Practical Method for Hierarchical-Preserving Layout Optimization of Integrated Circuit Layout," describes a method for scaling different layers in an integrated circuit (IC) design layout by different scaling factors without creating so-called "pull-aparts," i.e., situations where two touching shapes on the same layer do not touch after being scaled. In this application, a method is taught on how to apply these techniques to a hierarchical design by specifying constraints for interfaces between hierarchical design levels and by showing how the placement of hierarchical elements (e.g., libraries or macros) can be specified during the scaling. Additionally, the invention allows different functional components embedded in an overall design to be scaled differently, without the necessity for disassembly and reassembly. The invention also can be used to scale by selected regions of any size up to and including an entire chip, based on any selection criteria, e.g., pattern matching, hierarchy, name, etc. The invention thus allows for: a) the scaling itself to be an optimization process—some scaling targets will be met and some not met. This allows a designer to impose and obey certain methodology constraints (such as pin locations). b) In the case where sub-circuits grow as a consequence of the scaling, the placement of the circuits is modified to preserve layout topology. c) The scaling can be applied component by component, as a design is assembled, or the scaling can be applied to the fully assembled (placed and routed) design at the end. d) A very fine degree of control is allowed over the scaling—by component, by layer, or even by geographic location.

The invention also includes a manufacturing yield improvement loop (FIGS. 2-3) that extends back to the original design, without involving the original designer. This loop can be run in real time in the manufacturing environment, or it can be applied when new masks are built. The advantage of this flow is that it makes the manufacturing/design feedback loop a tighter, more focused loop than currently exists. A cost target can be set for a design, and the size of the layout (chips per wafer) versus yield can be automatically adjusted throughout the life of the design and process, in order to meet that target.

In a "maskless lithography" world, this optimization could be applied batch-to-batch in manufacturing. In a "mask" world, this optimization could be applied whenever a new mask set is needed. Given that mask lifespans are limited, a long-running design may go through multiple sets of masks.

B. Selective Scaling Methodology

Given a ground-rule correct hierarchical IC design layout and feedback from manufacturing describing known problems, the design layout is scaled by a scaling factor for each object, i.e., layer, region and/or cell-specific values.

Scaling Techniques

The selective scaling methodology may implement different scaling techniques depending on the parts to be scaled. For purposes of this invention, three different scaling techniques will be described. It should be recognized, however, that other now known or later developed scaling techniques may be implemented. The three scaling techniques include: Flat Scaling, Minimum Perturbation Compaction, and Scaling of Custom Circuitry. Since each of these scaling techniques is described in detail in other U.S. patent applications or otherwise known by those with ordinary skill in the art, details of each will not be made.

a) Flat Scaling

A flat scaling of library elements uses the technique described in U.S. patent application Ser. No. 10/438,625, entitled "A Practical Method for Hierarchical-Preserving Layout Optimization of Integrated Circuit Layout," to scale the data using appropriate scale factors for different layers/regions.

b) Minimum Perturbation Compaction

For circuits with defined border methodology (e.g., RLMs, bit stacks) use, a longest-path analysis referred to as minimum perturbation (hereinafter "minpert") compaction may be used to calculate the amount by which each sub-cell will grow. Minpert compaction is described in U.S. patent application Ser. No. 10/707,287, entitled "Circuit Area Minimization Using Scaling," which is hereby incorporated by reference. In this technique, the placement location of each sub-cell is modified so that after expansion, their boundary shapes abut. Then, each macro circuit is scaled hierarchically.

c) Scaling of Custom Circuitry

With pure custom circuits, the macro is typically scaled in two passes. The first-pass scaling modifies shapes and transform locations. "Transform" refers to a location of a circuit in terms of an X value, a Y value, a mirror value and a rotation value. For example, a circuit may have location of X=5, Y=4, be mirrored about the X-axis and a 90° rotation value (in this example, a shape vertex at point 5, 4 would first move to 5, −4 with the mirroring, then move to 4, 5 when rotated +90 degrees). A transform location modification changes the outline of the shape, thus changing its position relative to its neighbors. In a second pass, transform locations are rounded to integer values and ground-rule fix-up is performed using the layout optimizer, i.e., to accommodate the neighboring shape requirements.

2. Selective Scaling Technique

Figure 2:
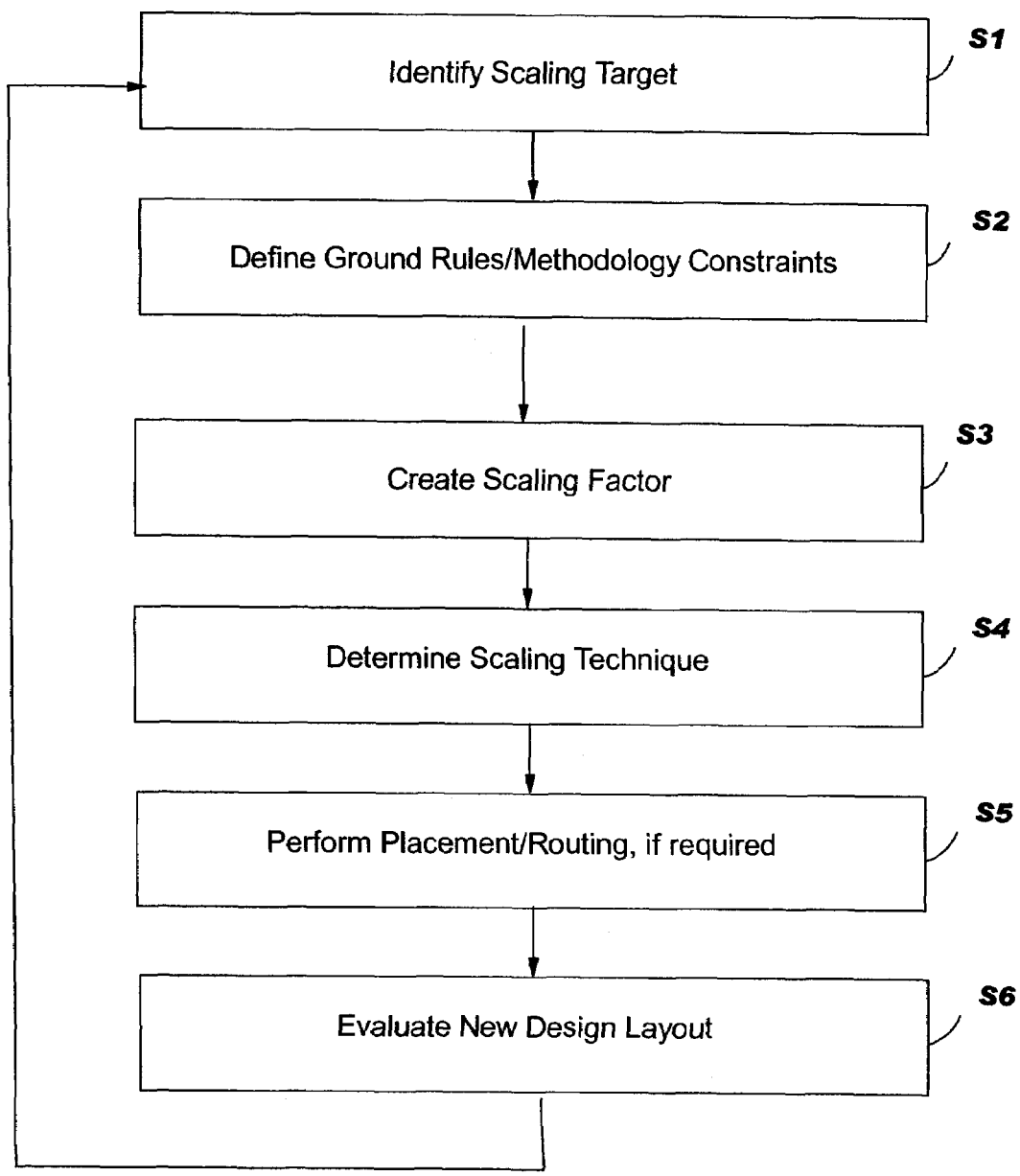
FIG. 2 shows a flow diagram of operational methodology of the system of FIG. 1.

Turning to FIG. 2, operational methodology of system 100 according to one embodiment of the invention will now be described. In step S1, based on information from manufacturing, at least one scaling target for at least one object of the design layout is identified by scaling target identifier 126. An "object" as used herein means a layer, region and/or cell (i.e., one or more layers, one or more regions, one or more cells, or a combination of those) of the design layout. As used herein, a "cell" is any placeable part of an IC design, sometimes referred to as macros, cells, sub-cells, etc. In addition, in certain instances, an "object" may include the entire chip. This step may include manual identification of a layer, region and/or cell by, for example, a person familiar with the manufacturing process and yield issues. Alternatively, this step may be carried out by any now known or later developed automated failure analysis system that can identify a layer, region and/or unit that is causing yield issues and may be a target for scaling. In addition, step S1 may include determining how much scaling is ideally required. "Manufacturing information" may be any information usable to identify a scaling target for an object. Manufacturing information will be described in greater detail below. Problem objects are identified regardless of whether they relate to design-related layout patterns that are known to be difficult to manufacture, or process-related defects, e.g., lines, vias, or other structures on a particular level which are not printing well.

In step S2, the technology ground rules are defined for each object having a scaling target. This step is required because the scaling may be applied to more than just layers. For example, spacing ground rules that apply to the object, e.g., wiring or pins, must be defined and obeyed. In addition, methodology constraints are defined. For example, cell boundaries that limit growth, pin shapes, pin position, wiring tracks, etc., are defined.

In step S3, a scaling factor is determined for each object having a scaling target. "Scaling factor" can be any form of changing the design now known or later developed. For example, the scaling factor may be one or more of a compensation (e.g., grow this unit by 3%), a new ground rule (e.g., change spacing for this layer by 2 nm), a scaling multiplier (e.g., decrease units on this layer by a factor of 0.011), etc.

In step S4, a determination is made as to which at least one of a plurality of scaling techniques is to be applied to each object. For example, for flat cells without a hierarchy (e.g., library cells), the object may be scaled using the Flat Scaling technique, i.e., the region is flattened, determine the hierarchy and scale according the Flat Scaling technique. The object may be, for example, a region having an X-Y space. It should be recognized that each object is evaluated individually in that an object may be positioned at one location which is to be scaled, and also at another location which is not to be scaled or may be scaled by another scaling factor. Another example is a cell with border methodology constraints, which may be composed of instances of sub-cells with abutting boundary shapes. In this case, the Min-Pert Compaction scaling technique may be appropriate. Each pure custom circuit will be scaled using the Pure Circuit scaling technique, i.e., in two passes.

In step S5, two different operations may occur depending on whether the above-described methodology is applied to: a) the objects and the chip re-assembled, or b) to the whole assembled circuit. In the former case, standard placement and routing technology is used to assemble the design using the scaled objects. In one embodiment, this step includes using an optimization-based hierarchical program to produce a legal layout for each object. In the latter case, the selective scaling is applied to an entire assembled circuit, i.e., the chip is the object, which eliminates the need to rerun placement and routing.

Step S6 represents an optional step in which the new design layout is evaluated by evaluator 134 to determine whether the expected behavior is achieved. Evaluator 134 may include software and/or hardware for comparing the new design layout to the old design layout, and a simulator to implement design intent information (defined below) and check tools to verify that the expected behavior is achieved. This step may be carried out after the new design layer is virtually generated, or after a manufacturing run. The process may then repeat, as shown in FIG. 2.

3. Example Implementations

The following illustrative implementations are not exhaustive and, therefore, should not be considered limiting of the attached claims. In a first example, a particular library cell in a design may require scaling of certain levels. A second example includes a particular redundant via cell. For example, if a particular arrangement of vias was found to cause yield issues (perhaps due to an optical proximity correction (OPC) issue), the spacing or arrangement of this particular model could be changed in every occurrence. (OPC is a technique for improving printing of shapes, which is applied just before masks are made. OPC makes additions to or subtractions from difficult to print structures due to the optical effects and the small wavelength of light used. For example, an inside corner, like the bend in an "L," tends to fill-in a little during printing, so those corners get little notches cut out. Outside corners like the end of a line tend to round-off, so they get a small extra bump added.) A third example includes a situation in which difficulty with only a particular metal layer (e.g., M1) in a chip is observed. In this case, a chip-wide scaling of just that metal layer is necessary.

C. Application of Selective Scaling to Yield Learning

The above-described method can be applied to yield learning in a manufacturing system 400 on a continuous basis, or as new masks are built using the following methodology. The following methodology would occur as part of step S1, described above. It should be recognized that manufacturing system 400 may include similar computer-based sub-system structures (i.e., PU, I/O, busses, program products, etc.) as scaling system 100.

Figure 3:
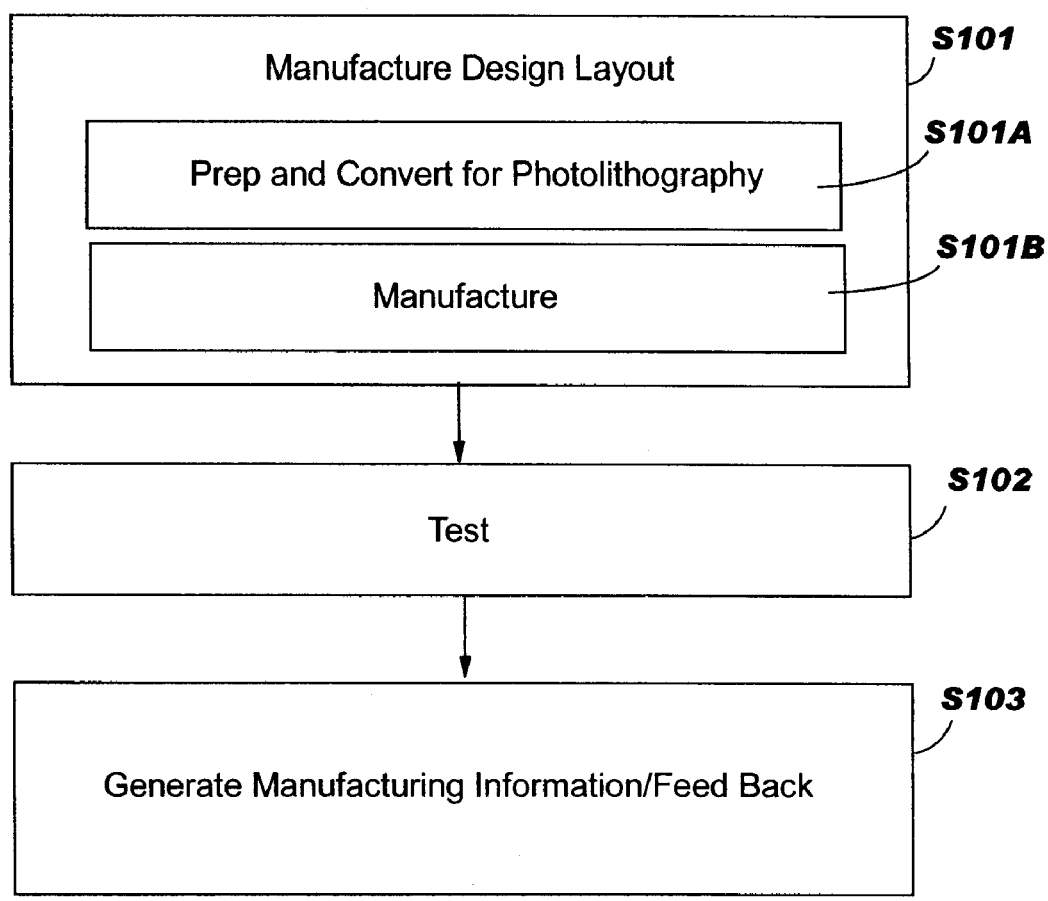
FIG. 3 shows a flow diagram of operation of the manufacturing system of FIG. 1.

Referring to FIG. 3, in a step S101, a design layout is manufactured by conventional manufacturing equipment 402. This step includes sub-step S101A preparing the design layout for photolithography, i.e., conventional data prep and conversion for masks or maskless data for tools. This step may include provision of design "intent" information by a designer to the manufacturing organization. This intent information is used during simulation of changes to the actual layout shapes, in order to ensure correct performance and function if small layout changes are made. For example, performance and tuning information and/or power information can be provided. In particular, a layout indicates how an IC works statically, but not how it functions dynamically, i.e., how fast or how much power is consumed in a clock cycle. Intent information may include data regarding static behavior deductions from the layout, the anticipated dynamic behavior such as performance and power. Also, noise to neighboring circuits or circuit groupings could be a piece of intent information. Circuit groupings may indicate circuits arranged so that they do not all switch simultaneously, because if they did it would cause a substantial voltage drop on a particular power bus so that some might not function correctly. In sub-step S101B, parts are manufactured.

In step S102, testing is conducted by conventional testing equipment 404. In one embodiment, testing includes characterizing operation by obtaining data indicating how well objects or features are able to be manufactured. For example, line monitors (e.g., kerfs or special wafers) may measure the ability of the process to print embedded lines at a particular pitch. In another example, kerf structures could monitor the performance of types of via combinations for printability.

At step S103, manufacturing information is generated by manufacturing information generator (MI) generator 406, and fed back to system 100 by any now known or later developed communications mechanism 408, e.g., a network. MI generator 406 may include any mechanism to generate the manufacturing information including, for example, mechanisms for determining when certain parameters exceed a threshold. In terms of parameters, manufacturing information may include, for example: a) Layers that should be scaled up to larger sizes or pitches because of unacceptable defects on those layers; b) Layers that can be scaled down to smaller sizes or pitches because of unexpectedly good manufacturability; c) Regions of a design that should be scaled up to a larger size in order to minimize systematic defects in these particular regions; d) Regions of a design that can be scaled down to a smaller size due to unexpectedly low defect densities in those regions; e) Cells that cannot be placed next to one another due to inappropriate interactions; and/or f) Cells that require modification to be placed next to one another to be more independent or tolerant of neighboring cells. Relative to the above described example in which line monitors measure the ability of the process to print embedded lines at a particular pitch: if the printable pitch drifts slightly, manufacturing information can be generated (next step) such that the above-described selective scaling can be applied to narrow or widen the actual pitch used in the design. The increments of change made could be very small, i.e., below that would be normally considered for ground rule changes (~10 nm, for example). Similarly, where kerf structures monitor the performance of types of via combinations for printability, manufacturing information could indicate that changes in vias are necessary, e.g., slight enlargement or spacing changes, in response to changes in the process. The manufacturing information is fed back and applied to the current layout as manufactured using the above-described selective scaling methodology. As discussed above, the manufacturing information is used to identify scaling targets for problem objects.

This yield learning process may be particularly helpful when moving a design to a new, second fabrication facility. The second fabrication facility is likely to have very slightly different "optimum" points for some ground rule values. Over time, these points can be found, and the part numbers optimized to the separate fabrication facilities.

III. Conclusion

In the previous discussion, it will be understood that the method steps discussed are performed by a processor, such as PU 114 of system 100, executing instructions of program product 122, stored in memory. It is understood that the various devices, modules, mechanisms and systems described herein may be realized in hardware, software, or a combination of hardware and software, and may be compartmentalized other than as shown. They may be implemented by any type of computer system or other apparatus adapted for carrying out the methods described herein. A typical combination of hardware and software could be a general-purpose computer system with a computer program that, when loaded and executed, controls the computer system such that it carries out the methods described herein. Alternatively, a specific use computer, containing specialized hardware for carrying out one or more of the functional tasks of the invention could be utilized. The present invention can also be embedded in a computer program product, which comprises all the features enabling the implementation of the methods and functions described herein, and which—when loaded in a computer system—is able to carry out these methods and functions. Computer program, software program, program, program product, or software, in the present context mean any expression, in any language, code or notation, of a set of instructions intended to cause a system having an information processing capability to perform a particular function either directly or after the following: (a) conversion to another language, code or notation; and/or (b) reproduction in a different material form.

While this invention has been described in conjunction with the specific embodiments outlined above, it is evident that many alternatives, modifications and variations will be apparent to those skilled in the art. Accordingly, the embodiments of the invention as set forth above are intended to be illustrative, not limiting. Various changes may be made without departing from the spirit and scope of the invention as defined in the following claims.

What is claimed is:

1. A method for selectively scaling an integrated circuit design layout, the method comprising the steps of:
    identifying a scaling target for at least two problem objects of the design layout based on feedback from a manufacturing process regarding problems caused by the problem objects in manufacturing an integrated circuit chip according to the design layout;
    defining technology ground rules and methodology constraints for each problem object;
    individually determining a scaling factor for each problem object without considering a scale factor of a different problem object of a same type as the problem object;
    determining which at least one of a plurality of scaling techniques is to be applied to each problem object, and scaling each problem object with a respective at least one scaling technique and scaling factor; and
    in a case that assembly is required, performing placement and routing to assemble the design using the scaled problem object.

2. The method of claim 1, wherein the at least two problem objects are selected from the group comprising: a layer, a region and a cell.

3. The method of claim 1, wherein the placement and routing performing step includes using an optimization-based hierarchical scaling program to produce a legal layout for each problem object.

4. The method of claim 1, wherein the scaling factor is at least one of: a compensation, a new ground rule and a scaling multiplier.

5. The method of claim 1, wherein the identifying step includes:
    manufacturing the design layout;
    testing the manufactured design layout and identifying at least two problem objects that are problems; and
    generating manufacturing information.

6. The method of claim 5, wherein the testing step includes characterizing operation and identifying the at least two problem objects by obtaining data indicating how well objects are able to be manufactured.

7. The method of claim 5, wherein the manufacturing information generating step includes generating the scaling target for the problem object.

8. The method of claim 1, further comprising the step of evaluating whether a new design layout including the scaled objects achieves an expected behavior.

9. A method for selectively scaling an integrated circuit design layout, the method comprising the steps of:
    identifying a scaling target for at least two problem objects of the design layout based on feedback from a manufacturing process regarding problems caused by the problem objects in manufacturing an integrated circuit chip according to the design layout;
    defining technology ground rules and methodology constraints for each problem object;
    individually determining a scaling factor for each problem object without considering a scale factor of a different problem object of a same type as the problem object;
    determining which at least one of a plurality of scaling techniques is to be applied to each problem object, and scaling each problem object with a respective at least one scaling technique and scaling factor; and
    in a case that assembly is required, performing placement and routing to assemble the design layout using the scaled problem object;
    wherein the scaling factor includes at least one of a compensation and a new ground rule.

10. The method of claim 9, wherein the identifying step includes:
    manufacturing the design layout;
    testing the manufactured design layout and identifying at least two problem objects that are problems; and
    generating manufacturing information.

* * * * *